US012761544B2

(12) United States Patent
Huang

(10) Patent No.: US 12,761,544 B2
(45) Date of Patent: Oct. 13, 2026

(54) DISSECTION METHOD FOR OPTICAL PROXIMITY CORRECTION AND PATTERNING METHOD

(71) Applicant: United Microelectronics Corp., Hsinchu (TW)

(72) Inventor: Pin Han Huang, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 726 days.

(21) Appl. No.: 18/329,584

(22) Filed: Jun. 6, 2023

(65) Prior Publication Data

US 2024/0353747 A1 Oct. 24, 2024

(30) Foreign Application Priority Data

Apr. 19, 2023 (CN) ........................ 202310422673.5

(51) Int. Cl.
*G03F 1/36* (2012.01)
*G03F 1/80* (2012.01)
*G03F 7/00* (2006.01)

(52) U.S. Cl.
CPC .................. *G03F 1/36* (2013.01); *G03F 1/80* (2013.01); *G03F 7/70491* (2013.01); *G03F 7/70616* (2013.01)

(58) Field of Classification Search
CPC .......... G03F 1/36; G03F 1/80; G03F 7/70491; G03F 7/70616
USPC ........................................................... 716/53
See application file for complete search history.

(56) References Cited

U.S. PATENT DOCUMENTS 6,665,856 B1 * 12/2003 Pierrat ................ G03F 7/70441 716/54
6,792,590 B1 * 9/2004 Pierrat ................ G03F 7/70441 430/5
9,053,287 B1 * 6/2015 Acosta .................. G06F 30/398
11,709,988 B2 * 7/2023 Batistakis .............. G06F 30/28 716/55
2002/0086225 A1 * 7/2002 Huang ...................... G03F 1/36 430/30
2002/0188924 A1 * 12/2002 Pierrat ...................... G03F 1/70 716/53

(Continued)

FOREIGN PATENT DOCUMENTS

EP 1395877 B1 * 3/2011 .............. H10P 50/71
JP 2001235853 A * 8/2001 ......... G03F 7/70633

OTHER PUBLICATIONS

Yiwei Yang et al., "Model-Based Dynamic Dissection in OPC", Journal of Semiconductors, Jul. 2008, pp. 1422-1427, vol. 29, No. 7.

*Primary Examiner* — Suresh Memula
(74) *Attorney, Agent, or Firm* — JCIPRNET

(57) ABSTRACT

A dissection method for optical proximity correction includes the following steps. An initial dissection is performed to define each side of a layout pattern as an original segment so as to form multiple original segments. It is determined whether an opposite side of a target side has an inside corner. A corner opposite dissection is performed to a target side to form multiple intermediate segments. It is judge which type of included angles between a target segment and each of its adjacent sides belongs to. A symmetrical dissection is performed according to the type of the included angles.

16 Claims, 7 Drawing Sheets

(56) References Cited

U.S. PATENT DOCUMENTS

| | | | | | |
|---|---|---|---|---|---|
| 2003/0008222 | A1* | 1/2003 | Pierrat | G03F 1/29 | 430/324 |
| 2004/0005089 | A1* | 1/2004 | Robles | G03F 1/36 | 382/141 |
| 2005/0091632 | A1* | 4/2005 | Pierrat | G03F 1/36 | 716/53 |
| 2005/0196686 | A1* | 9/2005 | Meyer | G03F 1/36 | 430/30 |
| 2006/0248496 | A1* | 11/2006 | Sezginer | G03F 1/36 | 703/2 |
| 2007/0157152 | A1* | 7/2007 | Strelkova | G03F 1/36 | 430/5 |
| 2009/0037867 | A1* | 2/2009 | Dick | G03F 1/36 | 716/50 |
| 2009/0077519 | A1* | 3/2009 | Hong | G03F 1/36 | 716/119 |
| 2012/0144349 | A1* | 6/2012 | Dai | G06F 30/398 | 716/52 |
| 2012/0144355 | A1* | 6/2012 | Dai | G06F 30/398 | 716/112 |
| 2012/0227023 | A1* | 9/2012 | Bendicksen | G06F 30/39 | 716/112 |
| 2013/0074024 | A1* | 3/2013 | Chase | G06F 30/398 | 716/112 |
| 2016/0125120 | A1* | 5/2016 | Yu | G06F 30/398 | 716/52 |
| 2022/0179323 | A1* | 6/2022 | Kang | G03F 7/70441 | |
| 2022/0413377 | A1* | 12/2022 | Choi | G03F 7/70308 | |
| 2023/0035090 | A1* | 2/2023 | Fujimura | G03F 1/74 | |
| 2024/0353747 | A1* | 10/2024 | Huang | G03F 7/70491 | |
| 2025/0190675 | A1* | 6/2025 | Niewczas | G06F 30/398 | |

* cited by examiner

DISSECTION METHOD FOR OPTICAL PROXIMITY CORRECTION AND PATTERNING METHOD

CROSS-REFERENCE TO RELATED APPLICATION

This application claims the priority benefit of China application serial no. 202310422673.5, filed on Apr. 19, 2023. The entirety of the above-mentioned patent application is hereby incorporated by reference herein and made a part of this specification.

BACKGROUND

Technical Field

The present disclosure relates to an integrated circuit and a manufacturing method thereof, and particularly relates to a dissection method for optical proximity correction and a patterning method.

Description of Related Art

In a semiconductor process, with the device size is continuously reduced, optical proximity correction (OPC) technology is adopted as a resolution enhancement technology. Generally, the layout pattern is dissected before the optical proximity correction is performed. However, the shot number of the existing dissection method is too large, so the dissection efficiency is too low.

SUMMARY

The present disclosure provides a dissection method for optical proximity correction and a patterned method, in which the shot number of the dissection method can be reduce and the dissection efficiency can be accordingly improved.

According to an embodiment of the present disclosure, a dissection method for optical proximity correction includes: performing an initial dissection to define each side of a layout pattern as an original segment so as to form a plurality of original segments; determining whether an opposite side of a target side has an inside corner; if there is an inside corner, performing a corner opposite dissection to the target side to form a plurality of intermediate segments; judging a type of included angles between an opposite side of the target segment and each of its adjacent sides, wherein the target segment comprises one of the plurality of original segments and the plurality of intermediate segments; and performing a symmetric dissection to the target segment according to the type of the included angles.

According to an embodiment of the present disclosure, a dissection method for optical proximity correction includes: providing a layout pattern; performing an initial dissection to define each side of the layout pattern as an original segment so as to form a plurality of original segments; performing an corner opposite dissection, wherein the corner opposite dissection comprises taking one side from the sides as a target side, and judging whether the corner opposite dissection is performed to the original segment corresponding to the target side according to a first included angle relationship, so as to form a plurality of intermediate segments or remain the original segment corresponding to the target side, wherein the first included angle relationship comprises an included angle based on an opposite side of the target side and its adjacent side or an included angle based on the target side itself and its adjacent side; and performing a symmetrical dissection, wherein the symmetrical dissection comprises dividing the target segment into a plurality of sub-segments symmetrical to each other according to a second included angle relationship, wherein the target segment comprises one of the plurality of intermediate segments or one of the plurality of original segments.

According to an embodiment of the present disclosure, a patterning method includes: providing a layout pattern; dissecting the layout pattern, comprising: performing a corner opposite dissection to divide the layout pattern into a plurality of corner blocks and a plurality of non-corner blocks, and performing a symmetrical dissection to divide the plurality of non-corner blocks into a plurality of sub-blocks; performing optical proximity correction to the plurality of sub-blocks and the plurality of corner blocks to form a plurality of optical proximity correction patterns; transferring the plurality of optical proximity correction patterns to a photomask; performing a lithography process by using the photomask as a mask, so as to form mask patterns in a mask layer on a substrate; and performing an etching process to transfer the mask patterns to a material layer between the substrate and the mask layer.

Based on the above, the dissection method for optical proximity correction and the patterning method of the embodiments of the present disclosure can reduce the shot number of dissection and improve the efficiency of dissection.

DESCRIPTION OF THE EMBODIMENTS

Figure 1:
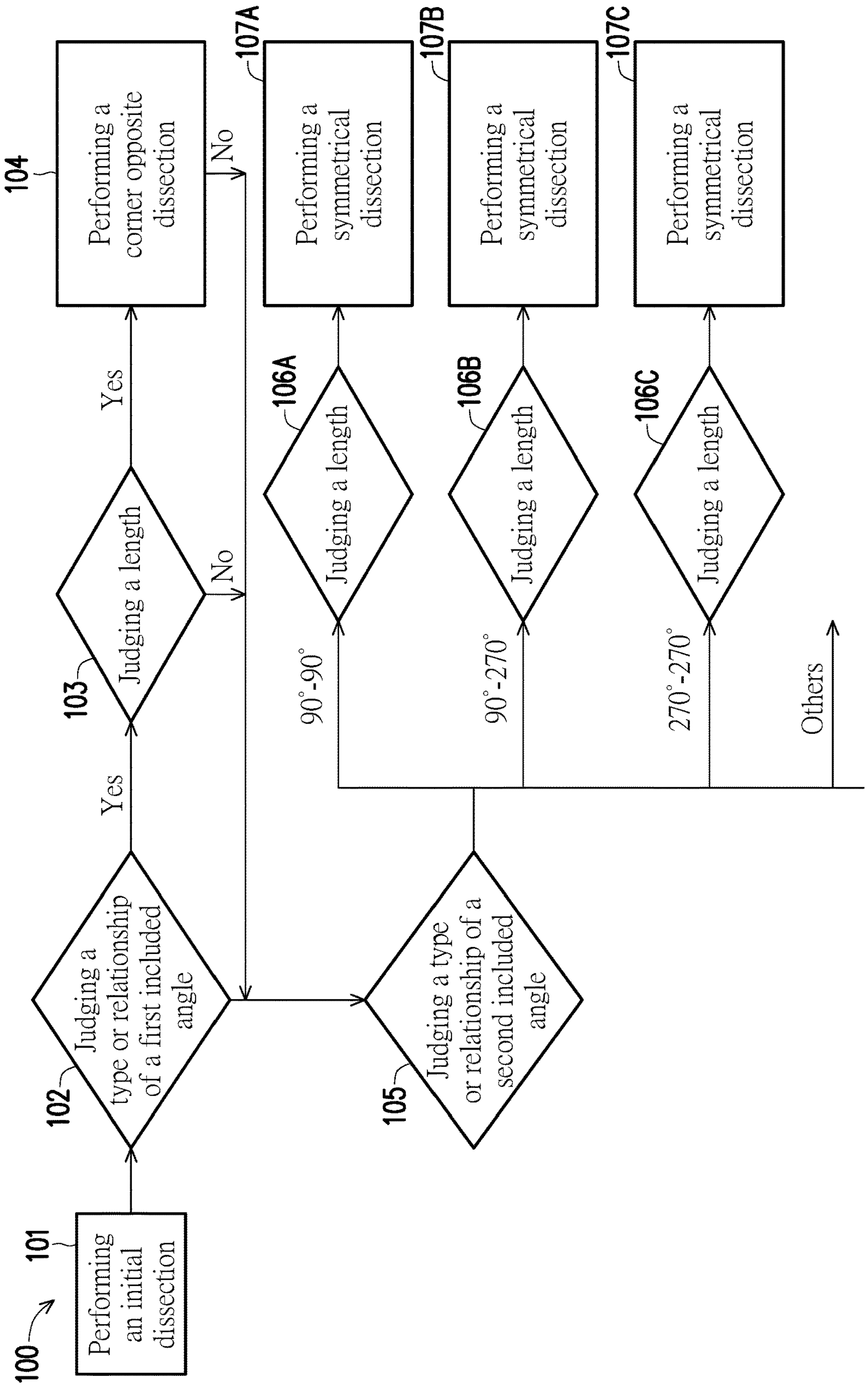
FIG. 1 is a block diagram of a dissection method for optical proximity correction according to an embodiment of the present disclosure.

FIG. 1 is a block diagram of a dissection method for optical proximity correction according to an embodiment of the present disclosure.

Referring to FIG. 1, a dissection method 100 for optical proximity correction according to an embodiment of the present disclosure includes act 101, which includes performing an initial dissection to define each side of a layout pattern as an original segment so as to form multiple original segments.

Figure 2A:
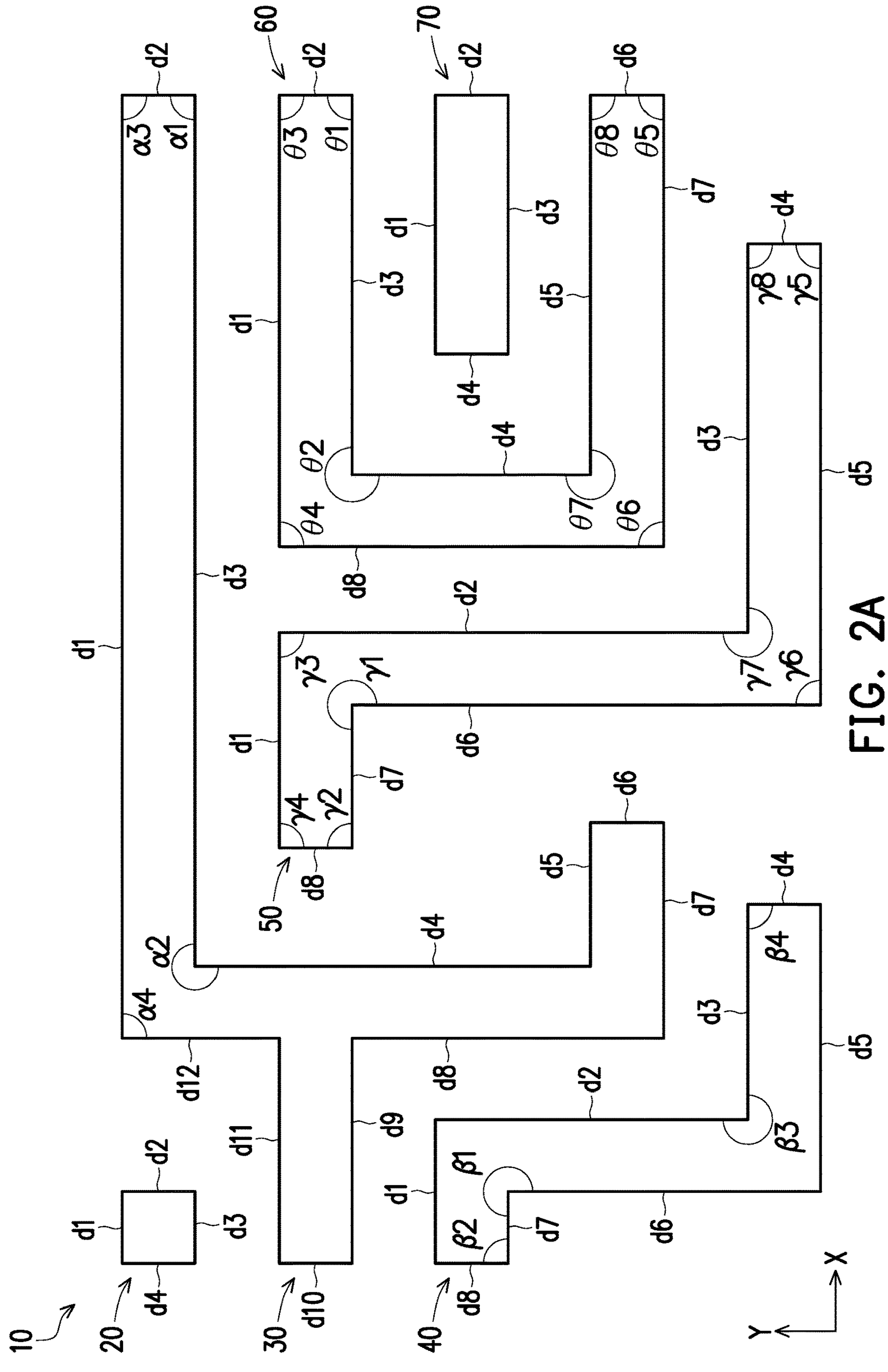
FIG. 2A to FIG. 2D are top views of a dissection method for optical proximity correction according to an embodiment of the present disclosure.

Referring to FIG. 2A, for example, the layout pattern 10 includes patterns 20, 30, 40, 50, 60 and 70. The pattern 20 has multiple sides d1-d4. The pattern 30 has multiple sides d1-d12. The pattern 40 has multiple sides d1-d8. The pattern 50 has multiple sides d1-d8. The pattern 60 has multiple sides d1-d8. The pattern 70 has multiple sides d1-d4.

Figure 2B:
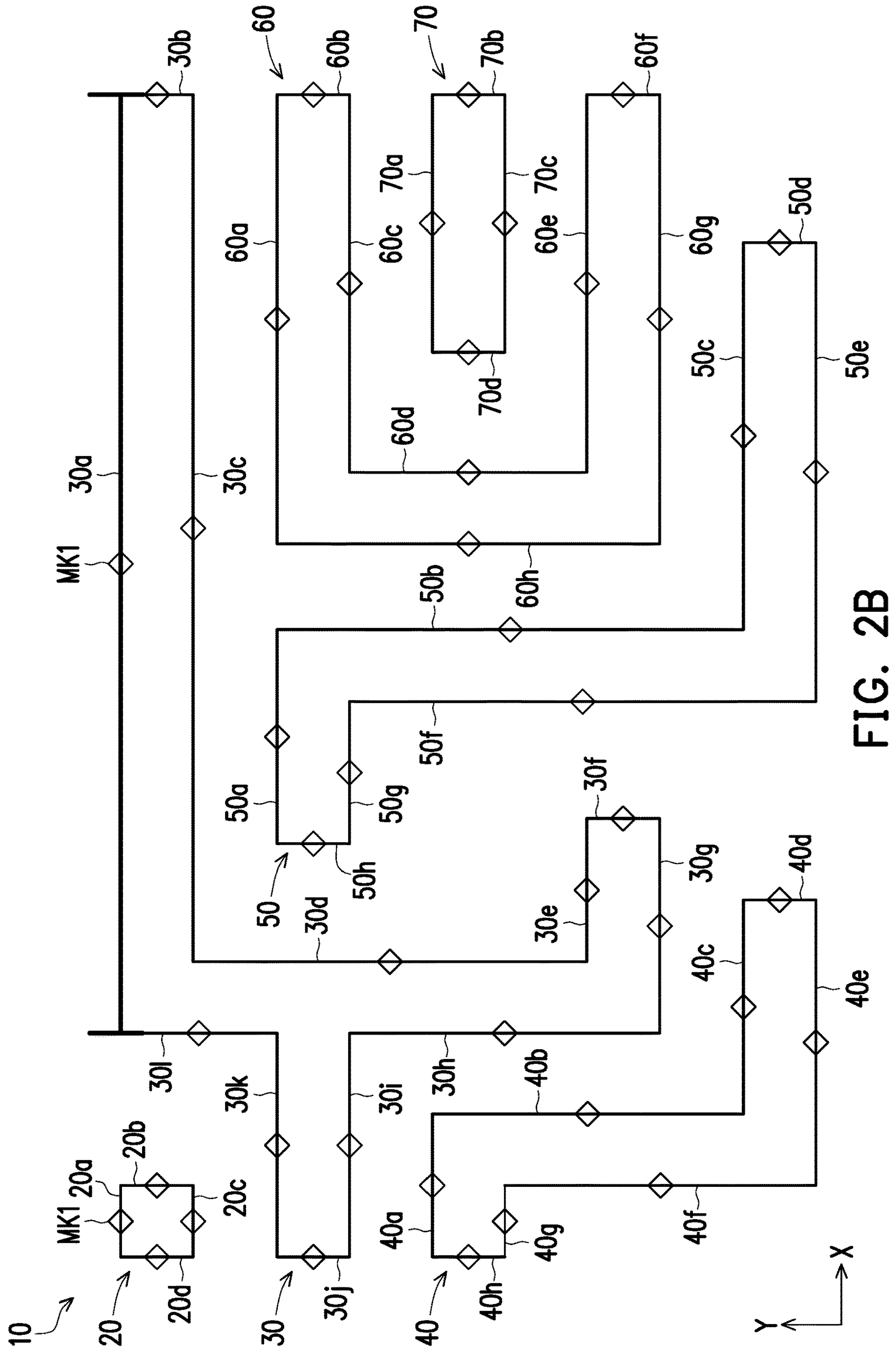

Referring to FIG. 2A and FIG. 2B, multiple sides d1-d4 of the pattern 20 are defined as original segments 20*a*-20*d*. Multiple sides d1-d12 of the pattern 30 are defined as original segments 30*a*-301. Multiple sides d1-d8 of the pattern 40 are defined as original segments 40*a*-40*h*. Multiple sides d1-d8 of the pattern 50 are defined as original segments 50*a*-50*h*. Multiple sides d1-d8 of the pattern 60 are defined as original segments 60*a*-60*h*. Multiple sides d1-d4 of the pattern 70 are defined as original segments 70*a*-70*d*. To simplify the drawing, multiple sides d1-d12 of the patterns 20, 30, 40, 50, 60 and 70 are shown in FIG. 2A. Multiple segments 20*a*-20*d*, 30*a*-301, 40*a*-40*h*, 50*a*-50*h*, 60*a*-60*h*, 70*a*-70*d* of the patterns 20, 30, 40, 50, 60 and 70 are shown in FIG. 2B. The center of each original segment 20*a*-20*d*, 30*a*-301, 40*a*-40*h*, 50*a*-50*h*, 60*a*-60*h*, 70*a*-70*d* of the pattern 20, 30, 40, 50, 60, and 70 is marked with a hollow diamond-shaped mark MK1.

Referring to FIG. 1, the dissection method for optical proximity correction according to an embodiment of the present disclosure includes act 102, which includes judging a type or relationship of a first included angle based on whether the opposite side of the target side has an inside corner.

Referring to FIGS. 2A and 2B, one side is selected from the sides d1-d12 of the patterns 20, 30, 40, 50, 60 and 70 as a target side. The opposite side of the target side has a first included angle relationship with each of its adjacent sides. In some embodiments, the first included angle relationship may include multiple rule groups, for example, two rule groups including 90° group and 270° group. When the first included angle relationship is 270 degrees, it indicates that the opposite side has an inside corner. When the first included angle relationship is 90 degrees, it indicates that the opposite side has no inside corner.

Referring to FIG. 2A, for example, the side d1 of the pattern 30 is taken as a target side. The opposite side d3 of the target side (side d1) has an included angle α1 with the adjacent side d2. The opposite side d3 of the target side (side d1) has an included angle α2 with the adjacent side d4. The included angle α1 is 90 degrees. The included angle α2 is 270 degrees. The included angle α2 may be called an inside corner. That is, the opposite side d3 of the target side (side d1) has an inside corner. For example, the side d3 of the pattern 30 is taken as a target side. The opposite side d1 of the target side (side d3) has an included angle α3 with the adjacent side d2. The opposite side d1 of the target side (side d3) has an included angle α4 with the adjacent side d12. The included angles α3 and α4 are both 90 degrees. That is, the opposite side d1 of the target side (side d3) does not have an inside corner. In the same manner, it can be determined whether the opposite sides of other sides of the pattern 30 have inside corners.

Referring to FIG. 2A, for example, the side d1 of the pattern 40 is taken as a target side. The opposite side d7 of the target side (side d1) has an included angle β1 with the adjacent side d6. The opposite side d7 of the target side (side d1) has an included angle β2 with the adjacent side d8. The included angle β1 is 270 degrees. The included angle β2 is 90 degrees. The included angle β1 may be called an inside corner. That is, the opposite side d7 of the target side (side d1) has an inside corner. The side d5 of the pattern 40 is taken as a target side. The opposite side d3 of the target side (side d5) has an included angle β3 with the adjacent side d2. The opposite side d3 of the target side (side d5) has an included angle β4 with the adjacent side d4. The included angle β3 is 270 degrees. The included angle β4 is 90 degrees. The included angle β3 may be called an inside corner. That is, the opposite side d3 of the target side (side d5) has an inside corner. In the same manner, it can be judged whether the opposite sides of other sides of the pattern 40 have inside corners.

Referring to FIG. 2A, for example, the side d1 of the pattern 50 is taken as a target side. The opposite side d7 of the target side (side d1) has an included angle γ1 with the adjacent side d6. The opposite side d4 of the target side (side d1) has an included angle γ2 with the adjacent side d8. The included angle γ1 is 270 degrees. The included angle γ2 is 90 degrees. The included angle γ1 can be called the inside corner. That is, the opposite side d7 of the target side (side d1) has an inside corner. Take side d7 of the pattern 50 as the target side. The opposite side d1 of the target side (side d7) has an included angle γ3 with the adjacent side d2. The opposite side d1 of the target side (side d7) has an included angle γ4 with the adjacent side d8. The included angle γ3 and γ4 are both 90 degrees. That is, the opposite side d1 of the target side (side d7) does not have an inside corner.

The side d3 of the pattern 50 is taken as a target side. The opposite side d5 of the target side (side d3) has an included angle γ5 with the adjacent side d4. The opposite side d5 of the target side (side d3) has an included angle γ6 with the adjacent side d6. The included angle γ5 and γ6 are both 90 degrees. That is, the opposite side d5 of the target side (side d3) does not have an inside corner.

The side d5 of the pattern 50 is taken as a target side. The opposite side d3 of the target side (side d5) has an included angle γ7 with the adjacent side d2. The opposite side d3 of the target side (side d5) has an included angle γ8 with the adjacent side d4. The included angle γ7 is 270 degrees. The included angle γ8 is 90 degrees. That is, the opposite side d3 of the target side (side d5) has an inside corner.

According to the above method, it can be determined whether the opposite sides of other sides of the pattern 50 have inside corners.

Referring to FIG. 2A, the side d1 of the pattern 60 is taken as a target side. The opposite side d3 of the target side (side d1) has an included angle θ1 with the adjacent side d2. The opposite side d3 of the target side (side d1) has an included angle θ2 with the adjacent side d4. The included angle θ1 is 90 degrees. The included angle θ2 is 270 degrees. That is, the opposite side d3 of the target side (side d1) has an inside corner.

The side d3 of the pattern 60 is taken as a target side. The opposite side d1 of the target side (side d3) has an included angle θ3 with the adjacent side d2. The opposite side d1 of the target side (side d3) has an included angle θ4 with the adjacent side d8. The included angle θ3 and 04 are both 90 degrees. That is, the opposite side d1 of the target side (side d3) does not have an inside corner.

The side d5 of the pattern 60 is taken as a target side. The opposite side d7 of the target side (side d5) has an included angle θ5 with the adjacent side d6. The opposite side d7 of the target side (side d5) has an included angle θ6 with the adjacent side d8. The included angle θ5 and θ6 are both 90 degrees. That is, the opposite side d7 of the target side (side d5) does not have an inside corner.

The side d7 of the pattern 60 is taken as a target side. The opposite side d5 of the target side (side d7) has an included angle θ7 with the adjacent side d4. The opposite side d5 of the target side (side d7) has an included angle θ8 with the adjacent side d6. The included angle θ7 is 270 degrees. The included angle θ8 is 90 degrees. That is, the opposite side d5 of the target side (side d7) has an inside corner.

According to the above method, it can be determined whether the opposite sides of the other sides of the pattern 60 have inside corners. According to the above method, it can also be judged that the opposite sides of all sides of patterns 20 and 70 have no inside corner.

Referring to FIG. 1, according to the above-mentioned first included angle relationship, it is determined whether a corner opposite dissection is performed. That is to say, the dissection method for the optical proximity correction according to an embodiment of the present disclosure includes act 104, which includes performing a corner opposite dissection to the target side to form multiple intermediate segments if there is an inside corner. The act 104 includes remaining the original segment without performing the corner opposite dissection to the target side if there is no inside corner.

Figure 2C:
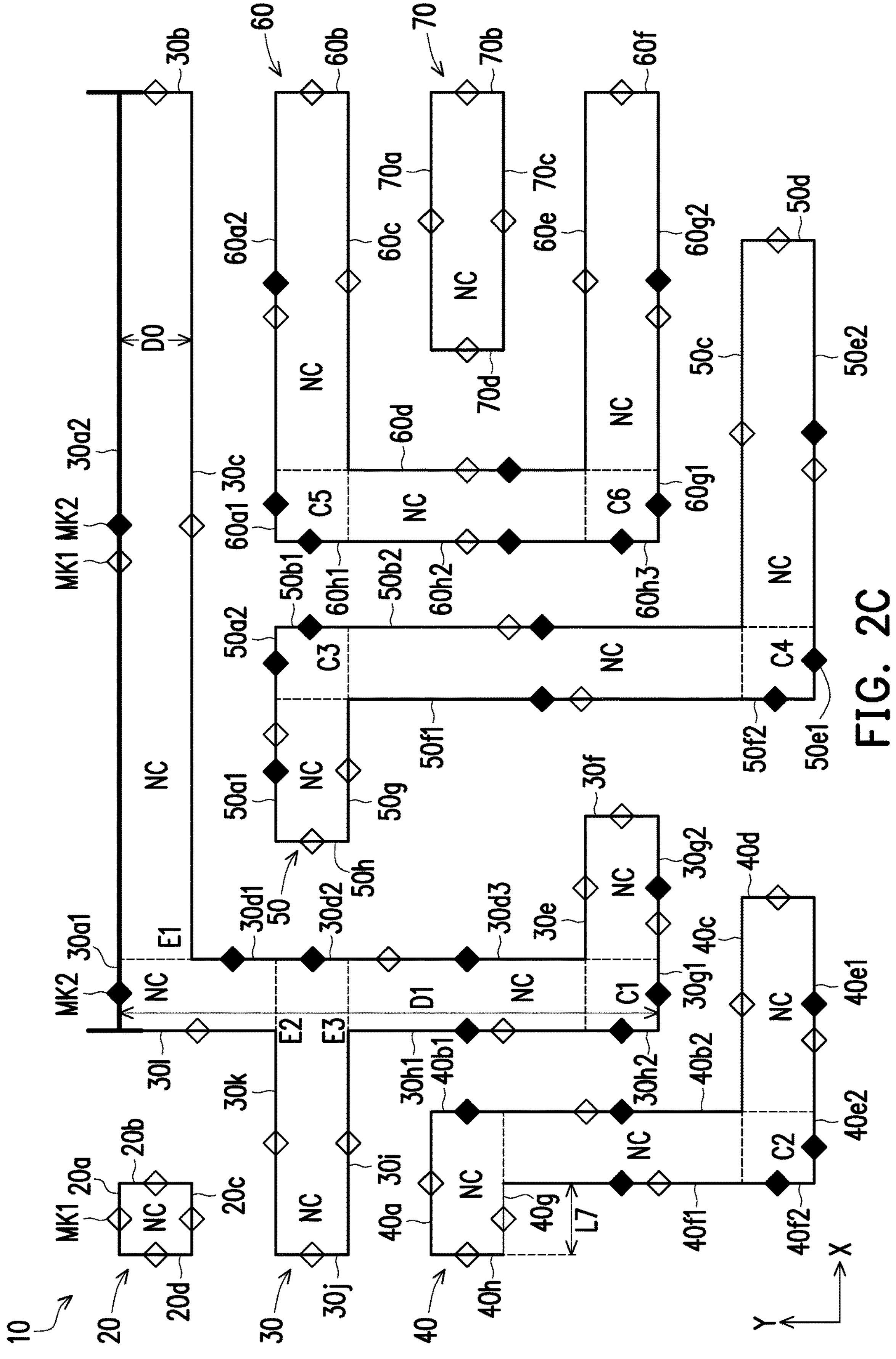

Referring to FIG. 2A to FIG. 2C, for example, the opposite side d3 of the target side d1 of the pattern 30 has an inside corner, and therefore, two solid diamond-shaped marks MK2 are marked at the target side d1 and at centers of two intermediate segments 30*a*1 and 30*a*2 divided from the original segment 30*a* of the target side d1. During the dissection, the end E1 of the original segment 30*c* of the opposite side d3 can extend along the Y direction and dissect opposite to the corner (called "corner opposite dissect" in some examples), so as to divide the original segment 30*a* of the target side d1 into intermediate segments 30*a*1 and 30*a*2.

Referring to FIGS. 2A to 2C, for example, the opposite sides d12 and d8 of the target side d4 of the pattern 30 have inside corners, therefore, three solid diamond-shaped marks MK2 are marked at the target side d4 and at centers of three intermediate segments 30*d*1, 30*d*2 and 30*d*3 divided from the original segment 30*d* of the target side d4. During the dissection, the end E2 of the original segment 301 of the opposite side d12 and the end E3 of the original segment 30*h* of the opposite side d8 can extend along the X direction and dissect opposite to the corners, so as to divide the original segment 30*d* of the target side d4 into three intermediate segments 30*d*1, 30*d*2 and 30*d*3.

Similarly, the original segments 30*g* and 30*h* corresponding to the target sides d7 and d8 of the pattern 30 are corner opposite dissected and divided into intermediate segments 30*g*1 and 30*g*2, 30*h*1 and 30*h*2, respectively, and solid diamond-shaped marks MK2 are marked at centers of the intermediate segments 30*g*1 and 30*g*2, 30*h*1 and 30*h*2.

The original segments 40*b*, 40*e*, and 40*f* corresponding to the target sides d2, d5, and d6 of the pattern 40 are corner opposite dissected and divided into intermediate segments 40*b*1 and 40*b*2, 40*e*1 and 40*e*2, 40*f*1 and 40*f*2, and solid diamond-shaped marks MK2 are marked at centers of the intermediate segments 40*b*1 and 40*b*2, 40*e*1 and 40*e*2, 40*f*1 and 40*f*2.

The original segments 50*a*, 50*b*, 50*e*, and 50*f* corresponding to the target sides d1, d2, d5, and d6 of the pattern 50 are corner opposite dissected and divided two intermediate segments 50*a*1 and 50*a*2, 50*b*1 and 50*b*2, 50*e*1 and 50*e*2, 50*f*1 and 50*f*2 respectively, and solid diamond-shaped marks MK2 are marked at centers of the intermediate segments 50*a*1 and 50*a*2, 50*b*1 and 50*b*2, 50*e*1 and 50*e*2, and 50*f*1 and 50*f*2.

The original segments 60*a*, 60*g*, and 60*h* corresponding to the target sides d1, d7, and d8 of the pattern 60 are corner opposite dissected and divided two intermediate segments 60*a*1 and 6*a*2, 60*g*1 and 60*g*2, 60*h*1, 60*h*2 and 60*h*3, and solid diamond-shaped marks MK2 are marked at centers of the intermediate segments 60*a*1 and 6*a*2, 60*g*1 and 60*g*2, 60*h*1, 60*h*2 and 60*h*3.

Referring to FIG. 1, however, in some cases, when the length of the original segment of the target side is lower than a set value, the original segment remains the same even though the opposite side of the target side has an inside corner, and no corner opposite dissection is performed. In some embodiments, before performing the corner opposite dissection (act 104), act 103 is first performed to judge a length of the original segment of the target side. It is judged whether the length of the original segment of the target side is less than a first set value. When it is less than the first set value, the original segment of the target side remains the same, no corner opposite dissection is performed, and act 105 is then performed. When it is greater than or equal to the first set value, the corner opposite dissection (act 104) is performed.

For example, the opposite sides of the target sides d9, d10 and d11 of the pattern 30 and the opposite sides of the target sides d1 and d8 of the pattern 40 have inside corners, but the lengths of the original segments 30*i*, 30*j*. 30*k*, 40*a*, 40*h*, 50*d*, 50*h* are lower than the set value, so the original segments 30*i*, 30*j*, 30*k*, 40*a*, 40*h*, 50*d*, and 50*h* remain the same, no corner opposite dissection is performed, and no solid diamond-shaped mark MK2 is marked.

In addition, if the opposite side of the target side does not have an inside corner, no corner opposite dissection is performed, the original segment of the target side remains the same, and no solid diamond-shaped mark MK2 is marked. For example, the opposite sides of the target sides d3, d5 of the pattern 30, the opposite side of the target side d3, d7 of the pattern 40, the opposite sides of the target sides d3, d7 of the pattern 50, the opposite sides of the target side d2, d3, d4, d5, d6 of the pattern 60, the opposite sides of the target sides d1-d4 of the pattern 20, and the opposite sides of the target sides d1-d4 of the pattern 70 have no inside corner, so no solid diamond-shaped mark MK2 is marked, no corner opposite dissection is performed, and the original segments 30*c*, 30*e*, 40*c*, 40*g*, 50*c*, 50*g*, 60*b*, 60*c*, 60*d*, 60*e*, 60*f*, 20*a*-20*d*, and 70*a*-70*d* of the target sides remain the same.

Referring to FIG. 2C, the pattern 20 includes original segments 20*a*-20*d*. The pattern 30 includes intermediate segments 30*a*1, 30*a*2, original segments 30*b*, 30*c*, intermediate segments 30*d*1, 30*d*2, 30*d*3, original segments 30*e*, 30*f*, intermediate segments 30*g*1, 30*g*2, 30*h*1, 30*h*2, and original segments 30*i*, 30*j*, 30*k*, 30*l*. The pattern 40 includes original segments 40*a*, 40*c*, 40*d*, intermediate segments 40*b*1, 40*b*2, 40*e*1, 40*e*2, 40*f*1, 40*f*2, and original segments 40*g*, 40*h*. The pattern 50 includes intermediate segments 50*a*1, 50*a*2, 50*b*1, 50*b*2, original segments 50*c*, 50*d*, intermediate segments 50*e*1, 50*e*2, 50*f*1, 50*f*2, and original segments 50*g*, 50*h*. The pattern 60 includes intermediate segments 60*a*1, 60*a*2, original segments 60*b*, 60*c*, 60*d*, 60*e*, 60*f*, and intermediate segments 60*g*1, 60*g*2, 60*h*1, 60*h*2, 60*h*3. The pattern 70 includes original segments 70*a*-70*d*.

Referring to FIG. 2C, on the other hand, the pattern 30 is divided into a corner block C1 and multiple non-corner blocks NC. The pattern 40 is divided into a corner block C2 and multiple non-corner blocks NC. The pattern 50 is divided into corner multiple blocks C3, C4 and multiple non-corner blocks NC. The pattern 60 is divided into multiple corner blocks C5, C6 and multiple non-corner blocks NC. The patterns 20 and 70 only have non-corner blocks NC, but have no corner block.

Referring to FIG. 1, the dissection method for optical proximity correction according to an embodiment of the present disclosure includes act 105, which includes judging a type or relationship of a second included angle. The type or relationship of second included angle can be divided into a first type, a second type or a third type. The first type, the second type or the third type all discuss the target segments of the non-corner blocks NC, but does not discuss the corner blocks C1-C6. The target segment can be an intermediate segment of a non-corner block NC or an original segment. The first type is related to the distance between the target segment and the opposite side. The second type is the case where the target segment is an original segment. The third type is the case where the target segment is an intermediate segment. The type or relationship of the second included angle can include multiple groups. For example, it includes at least 90°-90° group, 90°-270° group and 270°-270° group. Other groups may also be included in other embodiments.

The first type includes a first sub-type and a second sub-type. The first sub-type of the first type is as follows: when the distance between the target segment and its opposite side is less than a second set value, the second included angle relationship is determined according to the type of included angle between the opposite side of the target segment and its adjacent side. The second sub-type of the first type is as follows: when the distance between the target segment and its opposite side is equal to or greater than the second set value, the second included angle relationship is determined according to the type of the included angle between the target segment itself and its adjacent side.

The second type includes a first sub-type and a second sub-type. The first sub-type of the second type is as follows: when the target segment is an original segment, and the opposite side of the target segment is also an original segment, the type or relationship of the second included angle is judged by the type of the included angle between the opposite side of the target segment and its adjacent side. The second sub-type of the second type is as follows: when the target segment is an original segment and the opposite side of the target segment has been dissected, the type or relationship of the second included angle is judged by the type of the included angle between the target segment itself and its adjacent side.

The third type includes a first sub-type and a second sub-type. The first sub-type of the third type is as follows: when the target segment of the non-corner block NC is an intermediate segment and the opposite side of the target segment is an original segment, the type or relationship of the second included angle is judged by the type of the included angle between the opposite side and its adjacent side.

The second sub-type of the third type is as follows: when the target segment of the non-corner block NC is an intermediate segment and the opposite side of the intermediate segment has been dissected (e.g., including an intermediate segments), such case is classified into the same group. That is, in the second sub-type of the third type, the type or relationship of the second included angle includes a single group, and this single group may be one group of the first type, or may not belong to any group of the first type. For example, the second sub-type of the third type classifies the aforementioned cases into 90°-270° group.

Referring to FIG. 2C, for example, the target segment is an intermediate segment 30*a*2 of the non-corner block NC of the pattern 30. The distance D0 between the intermediate segment 30*a*2 and the opposite side d3 is smaller than a second set value, and the opposite side d3 is not dissected. Therefore, for the intermediate segment 30*a*2, according to the first sub-type of the first type, the included angle between the opposite side d3 and its adjacent side d2 is 90 degrees and the included angle between the opposite side d3 and its adjacent side d4 is 270 degrees, and the intermediate segment 30*a*2 is classified into the 90°-270° group.

For example, the target segment is the original segment 30*c* of the non-corner block NC of the pattern 30. The distance D0 between the original segment 30*c* and the opposite side d1 is smaller than a second set value, and the opposite side d1 is divided into intermediate segments 30*a*1 and 30*a*2. Therefore, for the original segment 30*c*, the original segment 30*c* can be classified as the 90°-270° group.

For example, the target segment is the intermediate segment 30*a*1 of the non-corner block NC of the pattern 30. The distance D1 between the intermediate segment 30*a*1 and the opposite side d7 is greater than a second set value, and the opposite side d7 has been divided into intermediate segments 30*g*1 and 30*g*2. Therefore, the intermediate segment 30*a*1 is classified into the 90°-270° group.

The type or relationship of the second included angles of the original segments and the intermediate segments of the non-corner blocks NC of the patterns 20, 30, 40, 50, 60 and 70 and can be determined according to the above method.

In short, in the first type, the second type and the first sub-type of the third type, the type or relationship of the second included angle is determined by second included angles defined between the opposite side of the target segment and its adjacent sides of the non-corner block NC or the included angles defined between the target segment itself and its adjacent sides. These types can be collectively referred to as a first rule. The type or relationship of the second included angle includes multiple groups. For example, it includes at least 90°-90° group, 90°-270° group and 270°-270° group. Other groups may also be included in other embodiments.

The second sub-type of the third type is as follows: when the target segment of the non-corner block NC and its opposite sides are all intermediate segments. This type of the second included angle can be classified into a single group, for example, the 90°-270° group. This type can be called a second rule.

Referring to FIG. 1, the dissection method for optical proximity correction according to an embodiment of the present disclosure includes acts 106A, 106B, and 106C, each of which includes determining the length of the target segment. If the length of the target segment is greater than or equal to a third set value, symmetrical dissections 107A, 107B, 107C are performed respectively. If the length of the target segment is smaller than the third set value, the symmetrical dissections 107A, 107B, 107C are not performed.

Figure 2D:
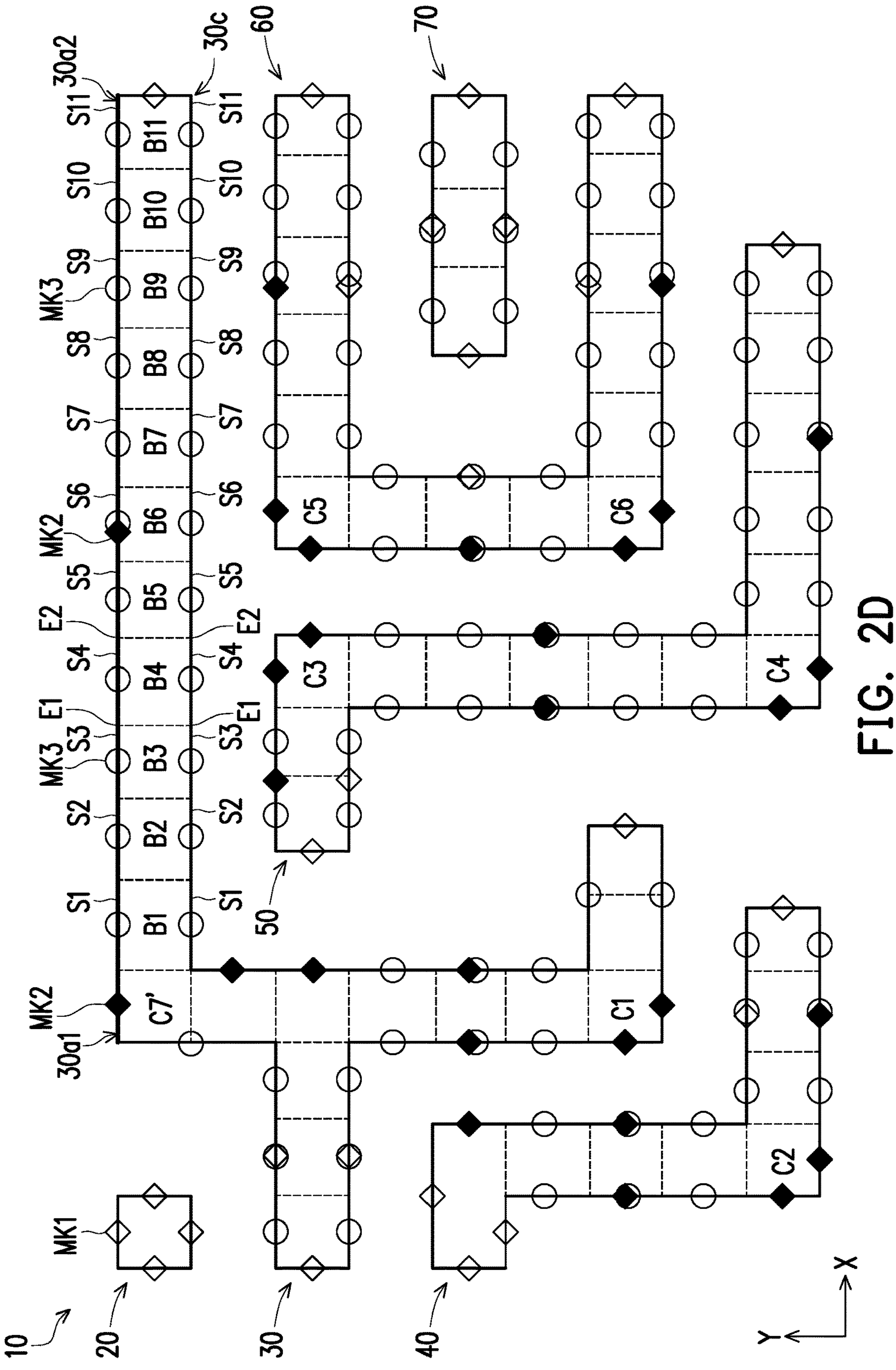

Referring to FIGS. 2C and 2D, when the target segment is the intermediate segment 30*a*1 (as shown in FIG. 2C) and the length of the intermediate segment 30*a*1 is less than a third set value, no symmetrical dissection is performed and the intermediate segment 30*a*1 remains.

Referring to FIGS. 2C and 2D, for example, when the target segment is the intermediate segment 30*a*2 (as shown in FIG. 2C), according to the above description, the second included angles of the intermediate segment 30*a*2 is classified into 90°-270° group. Since the length of the intermediate segment 30*a*2 is greater than the third set value, a symmetrical dissection can be performed. The intermediate segment 30*a*2 is divided into multiple sub-segments S1-S11 according to the dissection rule of 90°-270° group, and a hollow circular mark MK3 is marled at the center of each sub-segment S1-S11.

Referring to FIGS. 2C and 2D, for example, when the target segment is the original segment 30*c* (as shown in FIG. 2C), according to the above description, the second included angle of the original segment 30*c* is classified into 90°-270° group. Since the length of the original segment 30*c* of the target segment is greater than the third set value, a symmetrical dissection can be performed. The original segment 30*c* is divided into multiple sub-segments S1-S11 according to the dissection rule of 90°-270° group, and a hollow circular mark MK3 is marked at the center of each sub-segment S1-S11.

The original segment 30*c* and the intermediate segment 30*a*2 are corresponding segments at two opposite sides. After being dissected symmetrically, multiple sub-segments S1-S11 of the intermediate segment 30*a*2 are respectively symmetrical to the multiple sub-segments S1-S11 of the original section 30*c*. That is, for example, in the X direction, the first end E1 of the sub-segment S4 of the intermediate segment 30*a*2 is aligned with the first end E1 of the sub-segment S4 of the original section 30*c*; the second end E2 of the sub-segment S4 of the intermediate segment 30*a*2 is aligned with the second end E2 of the sub-segment S4 of the original section 30*c*. Thus, the sub-segment S4 of the intermediate segment 30*a*2 and the sub-segment S4 of the original segment 30*c* may form a sub-block B4. Similarly, the sub-segments S1-S11 of the intermediate segment 30*a*2 and the sub-segments S1-S11 of the original segment 30*c* may form multiple sub-blocks B1-B11.

According to the above method, the intermediate segments and the original segments of the non-corner blocks NC of the patterns 20, 30, 40, 50, 60 and 70 can be divided into multiple sub-segments, or the intermediate segments or the original segments can remain the same. In FIG. 2D, each original segment of patterns 20, 30, 40, 50, 60 and 70 is marked with a hollow diamond-shaped mark MK1. The solid diamond-shaped marks MK2 are marked at centers of the intermediate segments of the patterns 30, 40, 50, and 60. The hollow circle marks MK3 are marked at centers of the sub-segments of the patterns 30, 40, 50, 60 and 70. The non-corner blocks NC of the patterns 20, 30, 40, 50, 60 and 70 are formed into multiple sub-blocks.

With the method described in the embodiment of the present disclosure, the patterns can be divided into multiple corner blocks (e.g., corner blocks C1-C6 of the patterns 30, 40, 50, and 60) by performing the corner opposite dissections. After symmetrical dissections, the patterns are divided into multiple sub-segments with opposite sides symmetrical to each other (such as segments of the patterns 30, 40, 50, 60, and 70 marked with hollow circle marks MK3) or intermediate segments (such as segments of the patterns 30, 40, 50, 60, and 70 marked with solid diamond-shaped marks MK2), or remain the original segments without dissections (such as segments of the pattern 20 marked with hollow diamond-shaped marks MK1). After the symmetrical dissections, the patterns are also divided into corner blocks (such as the corner block C7' of the pattern 30).

Figure 3:
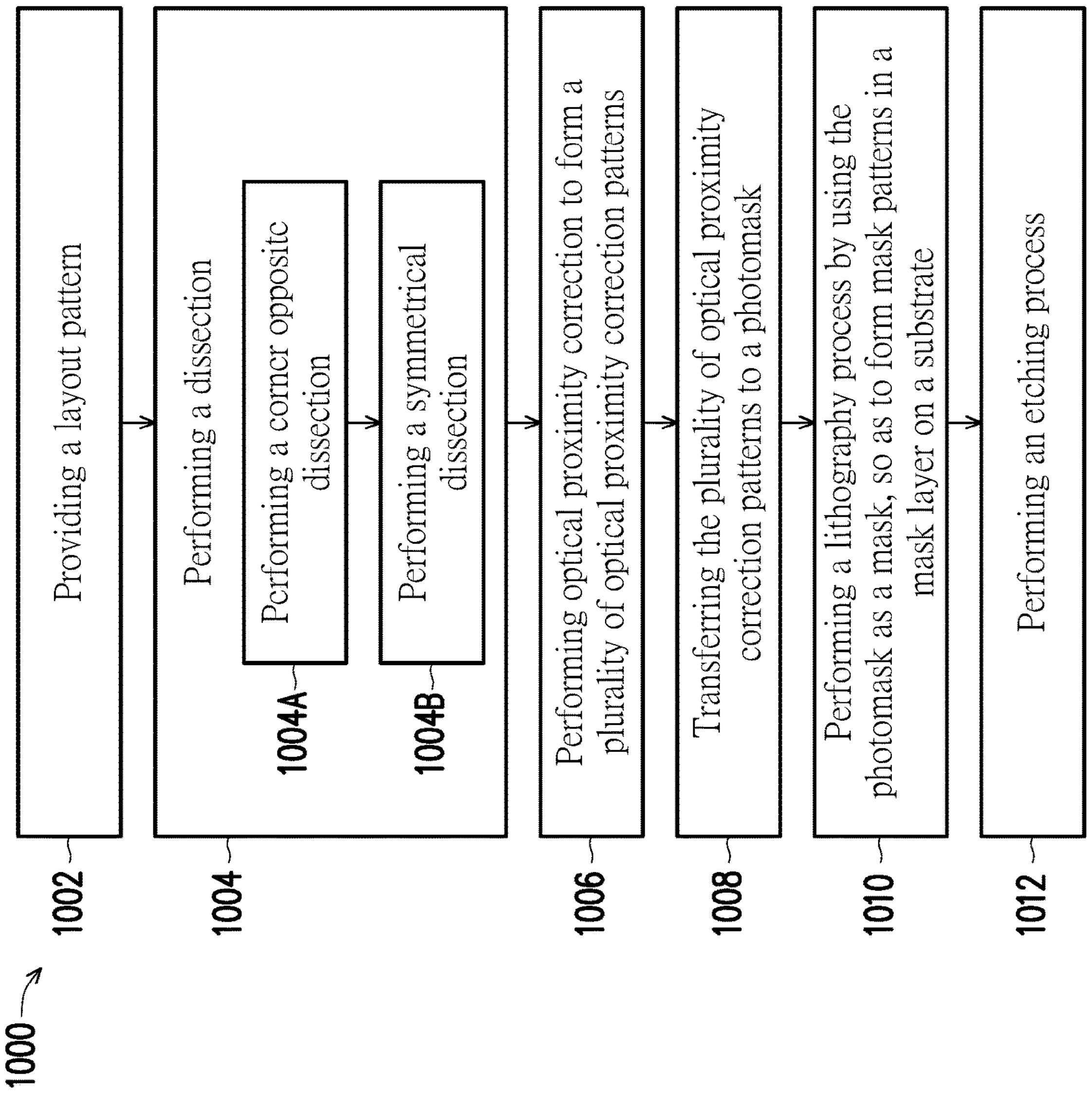
FIG. 3 is a flowchart of a patterning method according to an embodiment of the present disclosure.
Figure 4:
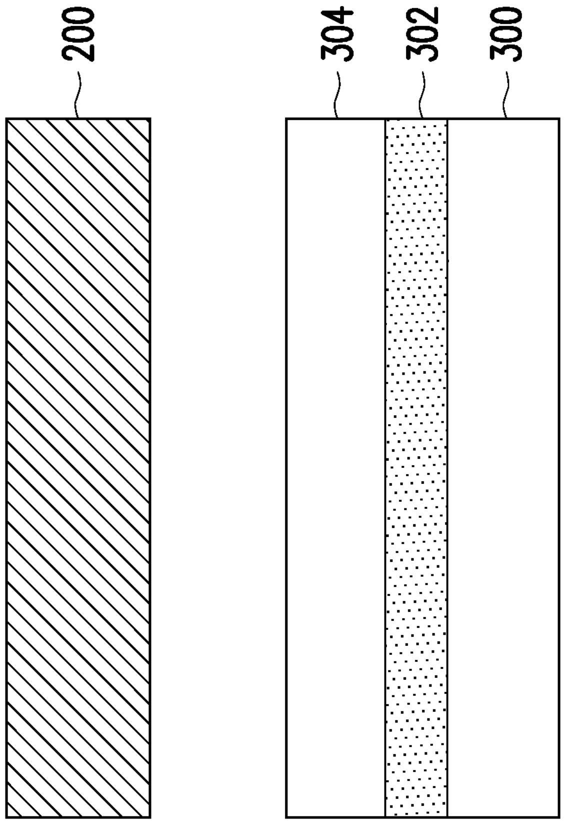
FIG. 4 is a cross-sectional view of a semiconductor device according to an embodiment of the present disclosure.

The dissection method for optical proximity correction described above can be applied to a semiconductor process. FIG. 3 is a flowchart of a patterning method according to an embodiment of the present disclosure. FIG. 4 is a cross-sectional view of a semiconductor device according to an embodiment of the present disclosure.

Referring to FIG. 3, a patterning method 1000 according to an embodiment of the present disclosure includes act 1002. Act 1002 includes providing a layout pattern. The layout pattern can be various patterns manufactured by integrated circuits. The layout pattern can include, for example, any one of the patterns 20-70 in FIG. 2A or a combination thereof.

Referring to FIG. 3, in act 1004, a dissection is performed to the layout pattern. The dissection may include performing a corner opposite dissection (act 1004A) and performing a symmetric dissection (act 1004B). The acts of performing the corner opposite dissection (act 1004A) and performing the symmetrical dissection (act 1004B) may be the same as or similar to the acts of performing the corner opposite dissection (act 104) and performing symmetrical dissection (acts 107A, 107B, 107C) described above with reference to FIG. 1.

Referring to FIG. 3, the corner opposite dissection (act 1004A) is performed to divide the layout pattern into multiple corner blocks and multiple non-corner blocks. The multiple corner blocks include, for example, any one of the corner blocks C1-C6 in the patterns 30-60 of FIG. 2C or a combination thereof. The multiple non-corner blocks include, for example, any one of the non-corner blocks NR in the patterns 20-70 of FIG. 2C or a combination thereof.

Referring to FIG. 3, a symmetrical dissection is performed (act 1004B) is performed to divide the multiple non-corner blocks into multiple sub-blocks. The multiple sub-blocks may refer to the sub-blocks B1 to B11 of the pattern 30 in FIG. 2D, for example.

Referring to FIG. 3, before performing the corner opposite dissection (act 1004A), the patterning method may include act of performing an initial dissection (act 101) to act of judging the length (act 103) as described above with reference to FIG. 1.

Referring to FIG. 3, before performing the symmetrical dissection (act 1004B), the patterning method may include act of judging the second included angle relationship and type (act 105) to act of judging the length (acts 106A, 106B, 106C) described above with reference to FIG. 1.

Referring to FIG. 3, in act 1006, which includes performing optical proximity correction to the multiple sub-blocks and the multiple corner blocks to form multiple optical proximity correction patterns. The optical proximity correction can be performed to the corner blocks C1-C6 and C7', or to other specific sub-blocks.

Referring to FIG. 3 and FIG. 4, in act 1008, the multiple optical proximity correction patterns are transferred to a photomask 200. That is to say, the patterns on the photomask 20 has been corrected by the optical proximity effect. The photomask 200 can be adapted to any known photomask.

Referring to FIG. 3 and FIG. 4, in act 1010, which includes performing a lithography process by using the photomask 200 as a mask, so as to form mask patterns in a mask layer 304 on a substrate 300. The mask layer 304 may include a photoresist layer. The photoresist layer can includes a positive photoresist or a negative photoresist. The photolithography process includes, for example, processes such as exposure, development, and baking. The substrate 300 may include a semiconductor substrate or a semiconductor compound substrate, such as a silicon substrate or a silicon germanium substrate.

Referring to FIGS. 3 and 4, an etching process is performed to transfer the mask patterns to a material layer 302 between the substrate 300 and the mask layer 304. The material layer 302 may include an insulating material, a semiconducting material, a conductive material, or a combination thereof. The insulating material may include silicon oxide, silicon nitride, silicon oxynitride or the like. The semiconductor material may include polysilicon. The conductive material can include a metal material such as tungsten, titanium or tantalum, or a metal nitride such as titanium nitride or tantalum nitride. The etching process may include a dry etching process or a wet etching process.

Afterwards, the mask layer 304 over the substrate 300 can be removed for subsequent manufacturing processes.

To sum up, the method of some embodiments of the present disclosure includes a corner opposite dissection and a symmetric dissection, which can effectively reduce the shot number of the layout pattern. In some embodiments, the shot number of the layout pattern can be reduced by 30% to 60%. Therefore, the efficiency of dissection can be greatly improved.

What is claimed is:

1. A dissection method for optical proximity correction, comprising:

performing an initial dissection to define each side of a layout pattern as an original segment so as to form a plurality of original segments;

determining whether an opposite side of a target side has an inside corner;

if there is an inside corner, performing a corner opposite dissection to the target side to form a plurality of intermediate segments;

judging a type of included angles between an opposite side of a target segment and each of its adjacent sides, wherein the target segment comprises one of the plurality of original segments and the plurality of intermediate segments;

performing a symmetrical dissection to the target segment according to the type of the included angles;

performing optical proximity correction to a plurality of sub-blocks and a plurality of corner blocks formed by the corner opposite dissection and the symmetrical dissection to form a plurality of optical proximity correction patterns; and transferring the plurality of optical proximity correction patterns to a photomask.

2. The dissection method for optical proximity correction according to claim 1, wherein if there is no inside corner, the corner opposite dissection to the target side is not performed, and the original segment corresponding to the target side remains the same.

3. The dissection method for optical proximity correction according to claim 1, wherein an angle of the inside corner comprises 270°.

4. The dissection method for optical proximity correction according to claim 1, further comprising, before performing the corner opposite dissection, performing a length judgment, and determining whether a first length of the original segment corresponding to the target side is less than a first set value, if the first length is greater than or equal to the first set value, the corner opposite dissection is performed; and if the first length is smaller than the first set value, the original segment corresponding to the target side remains the same, and the corner opposite dissection is not performed.

5. The dissection method for optical proximity correction according to claim 1, wherein the type of the included angles comprises at least three groups:

90°-90° group;

90°-270° group; and

270°-270° group.

6. A dissection method for optical proximity correction, comprising:

providing a layout pattern;

performing an initial dissection to define each side of the layout pattern as an original segment so as to form a plurality of original segments;

performing an corner opposite dissection, wherein the corner opposite dissection comprises taking one side from the sides as a target side, and judging whether the corner opposite dissection is performed to the original segment corresponding to the target side according to a first included angle relationship, so as to form a plurality of intermediate segments or remain the original segment corresponding to the target side, wherein the first included angle relationship comprises an included angle based on an opposite side of the target side and its adjacent side or an included angle based on the target side itself and its adjacent side;

performing a symmetrical dissection, wherein the symmetrical dissection comprises dividing a target segment into a plurality of sub-segments symmetrical to each other according to a second included angle relationship, wherein the target segment comprises one of the plurality of intermediate segments or one of the plurality of original segments;

performing optical proximity correction to a plurality of sub-blocks and a plurality of corner blocks formed by the corner opposite dissection and the symmetrical dissection to form a plurality of optical proximity correction patterns; and transferring the plurality of optical proximity correction patterns to a photomask.

7. The dissection method for optical proximity correction according to claim 6, wherein the first included angle relationship comprises at least two rule groups:

wherein the two rule groups comprise:

270° group; and

90° group.

8. The dissection method for optical proximity correction according to claim 7, wherein, when the first included angle relationship comprises 270°, the corner opposite dissection is performed to the original segment corresponding to the target side.

9. The dissection method for optical proximity correction according to claim 8, wherein, when the first included angle relationship comprises all 90°, the corner opposite dissection is not performed to the original segment corresponding to the target side, and the original segment corresponding to the target side remains the same.

10. The dissection method for optical proximity correction according to claim 6, further comprising, before performing the corner opposite dissection, performing a first length judgment, and judging whether a length of the original segment corresponding to the target side is less than a first set value, when the length is less than the first set value, the original segment corresponding to the target side remains the same, and the corner opposite dissection is not performed; and when the length is greater than or equal to the first set value, the corner opposite dissection is performed.

11. The dissection method for optical proximity correction according to claim 6, further comprising, before performing the corner opposite dissection, performing a distance judgment, and judging whether a distance between an opposite side of the target side and the target side is less than a second set value, when the distance is less than the second set value, the first included angle relationship is the included angle between the opposite side of the target side and its adjacent side, and the corner opposite dissection is performed; and when the distance is greater than or equal to the second set value, the first included angle relationship is the included angle between the target side itself and its adjacent side, and the corner opposite dissection is performed.

12. The dissection method for optical proximity correction according to claim 6, wherein performing the symmetrical dissection comprises:

judging whether the target segment and its opposite side are subjected to the corner opposite dissection, when one of the target segment and its opposite side comprises one of the original segments that has not been subjected to the corner opposite dissection, the symmetrical dissection is performed according to a first rule; and when each of the target segment and its opposite side is one of the intermediate segments, the symmetrical dissection is performed according to a second rule.

13. The dissection method for optical proximity correction according to claim 12, wherein the first rule at least comprises:

when the target segment is one of the original segments, and the opposite side of the target segment is one of the original segments, an included angle between the opposite side and its adjacent side is used as the second included angle relationship;

when the target segment is one of the original segments, and the opposite side of the target segment is one of the intermediate segments, an included angle between the target segment and its adjacent side is used as the second included angle relationship; and when the target segment is one of the intermediate segments, and the opposite side of the target segment is one of the original segments, an included angle between the opposite side and its adjacent side is used as the second included angle relationship.

14. The dissection method of optical proximity correction according to claim 13, wherein the second included angle relationship of the first rule comprises three groups:

90°-90° group;

90°-270° group; and

270°-270° group, wherein the second included angle relationship of the second rule is the same as the 90°-270° group of the first rule.

15. A patterning method, comprising:

providing a layout pattern;

dissecting the layout pattern, comprising:

performing a corner opposite dissection to divide the layout pattern into a plurality of corner blocks and a plurality of non-corner blocks; and performing a symmetrical dissection to divide the plurality of non-corner blocks into a plurality of sub-blocks;

performing optical proximity correction to the plurality of sub-blocks and the plurality of corner blocks to form a plurality of optical proximity correction patterns;

transferring the plurality of optical proximity correction patterns to a photomask;

performing a lithography process by using the photomask as a mask, so as to form mask patterns in a mask layer on a substrate; and performing an etching process to transfer the mask patterns to a material layer between the substrate and the mask layer.

16. The patterning method according to claim 15, wherein two opposite sub-segments of each sub-block are symmetrical to each other.

* * * * *